United States Patent
Mahatme et al.

(10) Patent No.: US 12,406,716 B2
(45) Date of Patent: Sep. 2, 2025

(54) REFRESH OPERATIONS IN EMBEDDED DYNAMIC RANDOM ACCESS MEMORIES (DRAMS)

(71) Applicant: NXP USA, Inc., Austin, TX (US)

(72) Inventors: Nihaar N. Mahatme, Austin, TX (US); Anirban Roy, Austin, TX (US); Uzi Zangi, Hod-Hasharon (IL)

(73) Assignee: NXP USA, Inc., Austin, TX (US)

( * ) Notice: Subject to any disclaimer, the term of this patent is extended or adjusted under 35 U.S.C. 154(b) by 104 days.

(21) Appl. No.: 18/529,175

(22) Filed: Dec. 5, 2023

(65) Prior Publication Data

US 2025/0182807 A1  Jun. 5, 2025

(51) Int. Cl.
  *G11C 11/40*  (2006.01)
  *G11C 11/406*  (2006.01)
(52) U.S. Cl.
  CPC ............................ *G11C 11/40603* (2013.01)
(58) Field of Classification Search
  CPC ................................................ G11C 11/40626
  See application file for complete search history.

(56) References Cited

U.S. PATENT DOCUMENTS

| | | | |
|---|---|---|---|
| 4,621,320 | A | 11/1986 | Holste et al. |
| 6,901,486 | B2 | 5/2005 | Handgen et al. |
| 8,982,654 | B2 | 3/2015 | Dong et al. |
| 9,086,882 | B2 | 7/2015 | Poddar |
| 2010/0321398 | A1 | 12/2010 | Kawahara |
| 2019/0026028 | A1* | 1/2019 | Chun ............ G11C 11/40626 |

FOREIGN PATENT DOCUMENTS

EP  1125300 B1  4/2003

OTHER PUBLICATIONS

Chen et al.: "A performance study of software and hardware data prefetching schemes," IEEE, Proceedings of 21 International Symposium on Computer Architecture, Apr. 18-21, 1994, DOI: 10.1109/ISCA.1994.288147, Chicago, IL, USA, pp. 223-232.
Chun et al.: "A 3T Gain Cell Embedded DRAM Utilizing Preferential Boosting for High Density and Low Power On-Die Caches," IEEE Journal of Solid-State Circuits, vol. 46, No. 6, Jun. 2011, pp. 1495-1505.
Chun et al.: "A 667 MHZ Logic-Compatible Embedded DRAM Featuring an Asymmetric 2T Gain Cell for High Speed On-Die Caches," IEEE Journal of Solid-State Circuits, vol. 47, No. 2, Feb. 2012, pp. 547-559.

(Continued)

*Primary Examiner* — Jason Lappas
(74) *Attorney, Agent, or Firm* — Joanna G. Geld

(57) ABSTRACT

A data processing system includes a dynamic random access memory (DRAM), a prefetcher, and a refresh controller. The DRAM includes a plurality of DRAM cells, each with a capacitive storage element. The prefetcher is configured to prefetch information from the DRAM into a prefetch buffer in accordance with a prefetch pattern of addresses in the DRAM. The refresh controller includes a dynamic refresh control circuit configured to detect prefetch patterns of the prefetcher, and, in response to a detected prefetch pattern, refresh locations of the DRAM in accordance with a refresh pattern of addresses which is based on the prefetch pattern of addresses.

20 Claims, 5 Drawing Sheets

(56) References Cited

OTHER PUBLICATIONS

Dahlgren et al.: "Sequential hardware prefetching in shared-memory multiprocessors," IEEE Transactions on Parallel and Distributed Systems, vol. 6, Issue: 7, Jul. 1995, DOI: 10.1109/71.395402, pp. 733-746.

Emma et al.: "Rethinking refresh: Increasing availability and reducing power in DRAM for cache applications," IEEE Computer Society, DOI Bookmark: 10.1109/MM.2008.93, Nov./Dec. 2008, vol. 28, pp. 47-56.

Isen et al.: "ESKIMO—energy savings using semantic knowledge of inconsequential memory occupancy for DRAM subsystem," IEEE, 2009 42nd Annual IEEE/ACM International Symposium on Microarchitecture (MICRO), New York, NY, USA, Dec. 12-16, 2009, pp. 337-346.

Reinman et al.: "Fetch Directed Instruction Prefetching," IEEE, MICRO-32. Proceedings of the 32nd Annual ACM/IEEE International Symposium on Microarchitecture, Haifa, Israel, DOI: 10.1109/MICRO.1999.809439, Nov. 16-18, 1999, pp. 1-12.

Wilkerson et al.: "Reducing Cache Power with Low-Cost, Multi-bit Error-Correcting Codes," DOI:10.1145/1815961.1815973, Corpus ID: 14857667, International Symposium on Computer Architecture, Jun. 19, 2010, pp. 1-11.

Zhu et al.: "Timing Local Streams: Improving Timeliness in Data Prefetching," ICS '10: Proceedings of the 24th ACM International Conference on Supercomputing, Jun. 2010, pp. 169-178.

\* cited by examiner

REFRESH OPERATIONS IN EMBEDDED DYNAMIC RANDOM ACCESS MEMORIES (DRAMS)

BACKGROUND

Field

This disclosure relates generally to integrated circuits, and more specifically, to refresh operations in embedded DRAMs.

Related Art

Due to their smaller sizes and improved scaling ability, embedded dynamic random access memories (DRAMs) are emerging as a strong alternative to static random access memories (SRAMs). DRAMs use capacitors as the storage elements, in which charged capacitor represents a first logic state (e.g. a logic level high) while a discharged capacitor represents a second logic state (e.g. a logic level low). The use of capacitors, though, require refresh operations, which add latency and inversely impact performance. Therefore, a need exists for an embedded DRAM with reduced latency.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, DRAMs require refresh operations to ensure that the capacitive storage elements maintain their stored data. In many cases, refresh operations are prioritized over read and write accesses to the DRAM to ensure stored data is restored before it is lost due to leakage. Therefore, if refresh operations clash with a read or write accesses to the DRAM, the read or write access is stalled, introducing increased latency. In one aspect, to reduce this latency, "look ahead" dynamic refreshes of the DRAM are performed in which these dynamic refreshes are performed in accordance with instruction or data prefetch patterns for the DRAM. These dynamic refreshes are performed in addition to regular refreshes periodically performed in the DRAM. In one embodiment, the DRAM is separated into multiple sub-arrays, in which dynamic refreshes are performed in one or more of the sub-arrays based on a prefetch pattern being performed in another of the sub-arrays. Furthermore, the dynamic refreshes in the one or more sub-arrays can be performed in parallel. Since regular refreshes are also performed in the DRAM, a priority controller determines which refresh is prioritized for a sub-array (regular refresh vs dynamic refresh).

Figure 1:
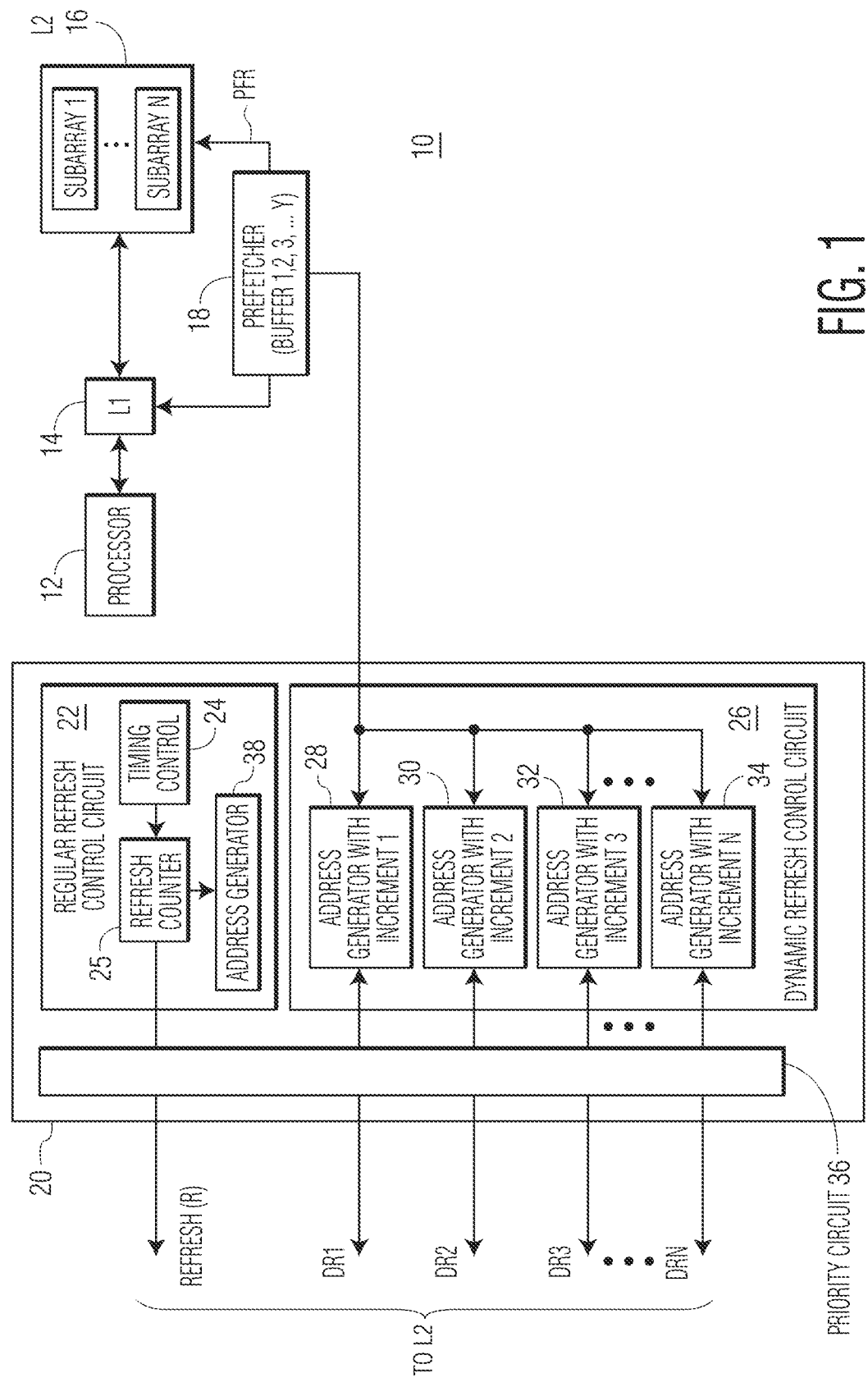
FIG. 1 illustrates, in block diagram form, a data processing system, having an embedded DRAM, a prefetcher, and a refresh controller, in accordance with one embodiment of the present invention

FIG. 1 illustrates, in block diagram form, a data processing system 10, in accordance with one embodiment of the present invention. Data processing system 10 may be implemented as a system on a chip (SoC), and may therefore also be referred to as SoC 10. Data processing system 10 includes a processor 12 (which may be any kind of processor, such as, for example, a central processing unit (CPU), graphics processing unit (GPU), etc.), a first level (L1) cache 14, a second level (L2) cache 16, a prefetcher 18, and a refresh controller 20. In the illustrated embodiment, L1 cache 14 is considered a lower level cache to processor 12 as compared to L2 cache 16, in which memory access requests from processor 12 are first made to L1 cache 14, and upon misses in cache 14, are made to L2 cache 16. In this example, L2 cache 16 may be implemented with a slower memory, as compared to L1 cache 14. In the illustrated embodiment, L2 cache 16 is implemented as a DRAM, and therefore, may also be referred to as embedded DRAM 16 or simply DRAM 16. (Note that data processing system 10 may include more elements than those illustrated in FIG. 1, such as additional processors or other masters, additional memories, peripherals, I/O devices, etc. Also, in alternate embodiments, caches 14 and 16 may not be present, and data processing system 10 may include an embedded DRAM in which the DRAM is not implemented as a cache. Therefore, the discussions herein with respect to DRAM 16 apply whether or not DRAM 16 is used as a cache.)

Figure 2:
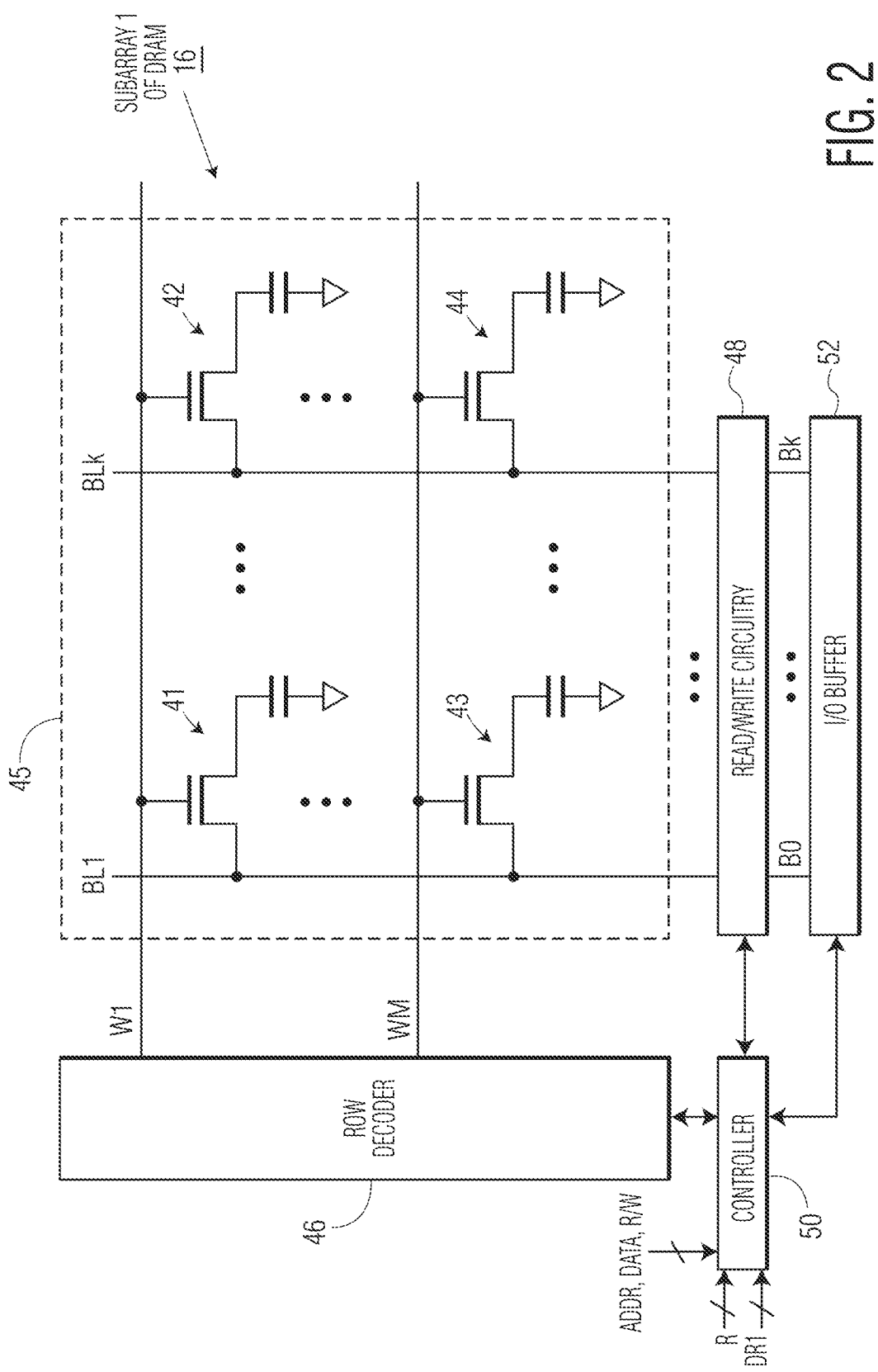
FIG. 2 illustrates, in partial schematic and partial block diagram form, a subarray of the DRAM of FIG. 1, in accordance with one embodiment of the present invention.
Figure 5:
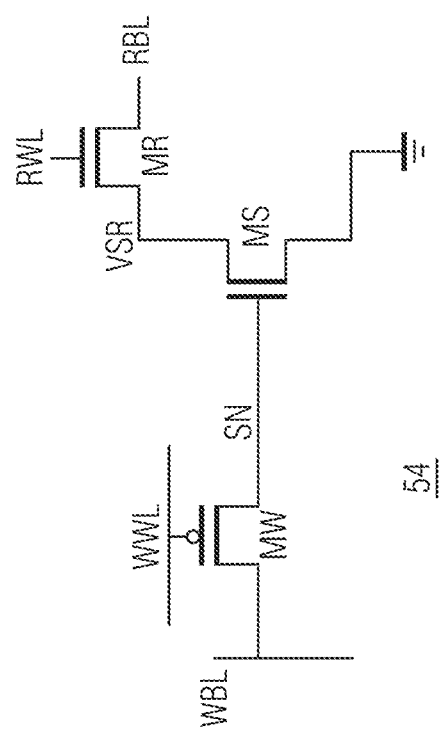
FIG. 5 illustrates, in schematic form, a DRAM cell in accordance with another embodiment of the present invention.

DRAM 16 may be divided into multiple, N, subarrays (e.g. subarray 1 to subarray N), in which N can be any integer number greater than zero. Each subarray includes a mutually exclusive set of rows of DRAM 16 (such as, e.g., 100 rows). In one embodiment, each subarray is an equal sized block of DRAM 16 (including a same number of rows). FIG. 2 illustrates, in partial block diagram and partial schematic form, subarray 1 of DRAM 16, in accordance with one embodiment of the present invention. Subarray 1 includes a plurality of DRAM bit cells 45 (including, e.g., bit cells 41, 42, 43, and 44) in which the bit cells are located at intersections of M word lines (W1-WM) and K bit lines (BL1-BLK). Each DRAM bit cell includes a capacitor (i.e. capacitive storage element) and a select transistor. The select transistor has a control electrode coupled to a corresponding word line, a first current electrode coupled to a corresponding bit line, and a second current electrode coupled to the capacitor. For example, the select transistor of DRAM bit cell 41, located at the intersection of W1 and B1, has a control electrode coupled to corresponding word line W1, a first current electrode coupled to corresponding bit line B1, and a second current electrode coupled to a first terminal of the capacitor. A second terminal of the capacitor is coupled to ground. Although FIG. 2 illustrates 1 transistor—1 capacitor (1T-1C) bit cells for DRAM bit cells 45, alternate embodiments may use any other type of DRAM bit cell, such as a 2-transistor (2T) DRAM bit cell or a 3-transistor (3T) DRAM bit cell (as illustrated in FIG. 5). Regardless of the type of DRAM bit cell in DRAM 16, each DRAM bit cell is structured the same, in which a charged capacitor represents a first logic state (e.g. a logic level high) while a discharged capacitor represents a second logic state (e.g. a logic level low).

Subarray 1 also includes a row decoder 46 coupled to the word lines W1-WM (each word line corresponding to a row of the subarray), read/write circuitry 48 coupled to bit lines BL1-BLK, an input/output (I/O buffer) 52, and a controller 50 coupled to row decoder 46, read/write circuitry 48, and I/O buffer 52. An access request to subarray 1 can be a read access request or a write access request and includes an access address (ADDR), write data (DATA) if the access request is a write request, and control information such as a R/W indicator to indicate whether the access request corresponds to a read or write access. Controller 50 receives ADDR, DATA, and R/W, and provides control signals accordingly to row decoder 46, read/write circuitry 48, and I/O buffer 52, as needed, to perform the requested access request. In one example, controller 50 provides ADDR to row decoder 46 which activates a selected word line of W1-WN based on ADDR. In the case of a write access, capacitors along the selected row (coupled to the selected word line) are charged or discharged by the read/write circuitry, in accordance with the corresponding write data, to properly store a logic one or logic zero, respectively, in each selected DRAM cell. The charging/discharging of the capacitor in each selected DRAM bit cells is done via the corresponding bit line and select transistor. For a read, charges on the capacitors along the selected row are sensed by corresponding sense amplifiers in the read/write circuitry to determine the stored states of the select row, in which the stored states are latched into I/O buffer 52 such that they can be returned as read data. Note that the writes and reads of DRAM 16 can be performed as known in the art. Also, based on some implementations of the DRAM cell, such as for a 1T-1C in which reads are destructive, a recharge of the capacitors can be performed after each read.

FIG. 5 illustrates a 3T DRAM cell 54 which may, in an alternate embodiment, be used for each DRAM cell of DRAM 16 (such as cells 41-44 of FIG. 2). In this embodiment, each word line of the subarray (e.g. each of W1-WM) would include both a write word line (WWL) and a read word line (RWL) and each bit line of the sub array (e.g. each of B1-BK) would include both a write bit line (WBL) and read bit line (RBL). The capacitor storage element is provided by a storage transistor (MS) coupled between a VSR node and ground and whose gate electrode corresponds to the storage node (SN) of the cell. The select transistor is implemented with a select transistor for writes (MW) and a select transistor for reads (MR). In the illustrated embodiment, the MW is implemented as a PMOS coupled between he WBL and SN and having a gate electrode coupled to the WWL, and the MR is implemented as an NMOS coupled between VSR and RBL and having a gate electrode coupled to RWL. The 3T DRAM cell operates as known in the art in which SN at the gate of MS is charged/discharged via a corresponding bit line (WBL/RBL) and select transistor (MW/MR).

Note that the descriptions and structure provided for subarray 1 also apply to each of the other subarrays of DRAM 16. Therefore, each subarray includes its own row decoder, read/write circuitry, I/O buffer, and controller. In one embodiment, each subarray includes a same number of DRAM bit cells, a same number of word lines and a same number of bit lines. Also, in alternate embodiments, the read/write circuitry (48) may include a column decoder in which a first portion of ADDR is used to activate a selected word line, and a second portion of the ADDR can be used to couple a selected subset of the bit lines to read/write circuitry. In this example, a selected row of the DRAM only includes those DRAM cells which are coupled to the selected row and the selected subset of the bit lines.

Since the stored charge on the capacitors of a DRAM leak away over time, regular refresh operations need to be periodically performed on the DRAM to maintain the stored data. Therefore, as illustrated in FIG. 1, refresh controller 20 of data processing system 10 includes a regular refresh control circuit 22 (also referred to as a periodic refresh control circuit) which periodically performs these regular refresh operation using a refresh counter 25, an address generator 38, and timing control circuit 24. Counter 25 is coupled to address generator 38 which provides the row address of the row to be refreshed. Counter 25 keeps track of the current address and increment pattern for addressing the rows of DRAM 16. For example, counter 25 can be sequentially incremented so as to address each row of DRAM 16, in which address generator 38 provides each of these addresses to DRAM 16, in turn, with a refresh request (R). Timing control circuit 24 is responsible for starting and stopping the regular refresh operations and control the frequency of the regular refreshes. For example, counter 25 can be reset by timing control circuit 24 in accordance with a particular refresh rate for the DRAM.

A refresh of a row includes performing a read of the row followed by a write to the row to restore the read value (i.e. write the read value) back to the row. In the illustrated embodiment, for the regular periodic refreshes, all DRAM cells in a selected row of DRAM 16 are refreshed. Therefore, as illustrated in FIG. 2, for each row refresh of the regular refresh, a refresh request (R) is provided (with a corresponding refresh address generated by address generator 38 based on counter 25) via a priority circuit 36 to the controller of each subarray (such as controller 50 of FIG. 2). In response to the refresh request, the controller of the subarray performs a refresh by reading the selected row followed by writing back the read data to the selected row.

Prefetcher 18 is coupled to L1 cache 14 and L2 cache 16, and performs prefetches (i.e. prefetch reads) for L1 cache 14 from L2 cache 16. These prefetch reads are intended to bring in data or instructions from L2 cache 16 into L1 cache 14 prior to being needed, as known in the art. In this manner, the chances of a memory access from processor 12 hitting in the faster L1 cache 14 is increased as compared to when prefetching is not utilized. Many different prefetch algorithms can be used to determine which address locations in DRAM 16 from which to prefetch in accordance with predicted prefetch patterns. For example, in one embodiment, a stream of instructions is prefetched in which prefetch reads are performed from subsequent memory locations in a linear pattern. In the case of instruction prefetching, branch instructions can be speculatively resolved so as to continue prefetching from either the target address (if the branch is taken) or the next sequential, i.e. fall-through, address (if the branch is not taken) in hopes that the branch speculation was correct. Alternatively, data may be prefetched in a predicted pattern. For example, in one embodiment, an array of data may be accessed in which every fourth address location is read. In this example, prefetches from every subsequent fourth address location can be performed. Therefore, prefetching takes advantage of temporal and spatial locality to "anticipate" what memory location will be read soon in hopes that subsequent demand fetches generated by the processor will access these anticipated locations and result in hits rather than misses in the L1 cache.

Prefetcher 18 includes any number, Y, of prefetch buffers (e.g. buffers 1, 2, 3, . . . , Y), in which each buffer may store prefetches from a corresponding subarray of DRAM 16. Each subarray of DRAM 16 may have zero or more corresponding prefetch buffers. For example, if each subarray of DRAM 16 has one corresponding buffer, Y=N. However, it is also possible for a particular subarray to have zero or multiple corresponding buffers. A prefetch buffer stores the prefetched information (obtained in response to the prefetch reads), in which the prefetched information may include instructions or data. The information in the prefetch buffers can be stored into L1 cache 14 in turn by control circuitry within L1 cache 14.

Each prefetch buffer may be used with a corresponding prefetch algorithm which generates read addresses for the prefetch read requests (PFRs) from DRAM 16 in accordance with a corresponding prefetch pattern. The prefetch read requests are generated by prefetcher 18 and provided to DRAM 16. In one embodiment, prefetcher 18 includes prefetch logic associated with each prefetch buffer which can independently implement the corresponding prefetch algorithm to achieve the corresponding prefetch pattern. In this manner, it is possible to have different cores of system 10 running their own programs in parallel using different subarrays, each generating its own prefetch pattern.

Refresh controller 20, in addition to regular refresh control circuit 22 also includes a dynamic refresh control circuit 26 and priority circuit 36. Regular refresh control circuit 22 performs periodic refreshes of DRAM 16, as described above, providing regular refresh requests (Rs) to DRAM 16 via priority circuit 36. Unlike regular refresh control circuit 22, dynamic refresh control circuit 26 is coupled to receive information from prefetcher 18. Dynamic refresh control circuit 26 also includes N address generators, each with a corresponding address increment, including address generator 28 with increment 1, address generator 30 with increment 2, address generator 32 with increment 3, . . . , address generator 34 with increment N. Each address generator generates a corresponding dynamic refresh request, DR1-DRN, respectively, each with a corresponding refresh address, which are provided to DRAM 16 via priority circuit 36.

Each dynamic refresh request is provided to the controller of a corresponding subarray of DRAM 16. For example, DR1 is provided to subarray 1 (to controller 50, as illustrated in FIG. 2), DR2 to subarray 2, DR3 to subarray 3, etc. The dynamic refresh addresses for each subarray can be generated based on a base address of the subarray (which can be any address within the subarray, such as the first or last address of the subarray) and adding the corresponding increment for each subsequent refresh request. In response to the dynamic refresh request, the controller of the subarray can perform the refresh by reading the DRAM cells selected by the corresponding refresh address followed by writing back the read data to the selected DRAM cells.

Each address generator of dynamic refresh control circuit 26 is configured to determine whether or not a prefetch pattern is currently being performed by prefetcher 18 in a subarray (i.e. an active subarray) of DRAM 16. In response to determining that a prefetch pattern is being performed, dynamic refresh addresses are generated in accordance with that prefetch pattern. For example, if prefetcher 18 is generating prefetch reads in accordance with a particular data pattern, that same data pattern is generated by each address generator. In one embodiment, while prefetcher 18 is generating prefetch reads to an active subarray of DRAM 16, the address generators corresponding to other subarrays of DRAM 16 are generating dynamic refresh addresses to the other subarrays which match the prefetch pattern of the prefetch reads to the active subarray. Therefore, each address increment of dynamic refresh control circuit 26 can be any integer value (including positive and negative values), as needed, to match a prefetch pattern being generated by prefetcher 18.

Dynamic refresh requests differ from regular refresh requests, in that regular refresh requests are periodically performed as controlled by a counter which sequentially refreshes each row of the DRAM in accordance with a DRAM refresh rate, regardless of any prefetch patterns. Also, as the dynamic refreshes utilizes a counter, the addressing is always linear and does not dynamically change based on DRAM read or write accesses. However, the dynamic refresh requests are performed to one or more subarrays in response to the detection of a prefetch pattern being performed in another one of the subarrays (in the active subarray), independent of the DRAM refresh rate. That is, the dynamic refreshes are not controlled by a sequential counter but by an address generator which follows the prefetch pattern. In this manner, the pattern of refresh addresses for a dynamic refresh are based on the pattern of prefetch addresses of the detected prefetch pattern. For example, the increment value (whether positive or negative) of the refresh address pattern used to generate each next refresh address is set to match the increment value of the prefetch address pattern used to generate each next prefetch address.

For example, if prefetch buffer 1 is prefetching information from address locations X, X+1, X+2, X+3, etc., from subarray 1, dynamic refresh control circuit 26 can determine this pattern (X, X+1, X+2, X+3, etc.) and apply this same pattern to one or more of subarrays 2-N to perform dynamic refreshes in accordance with the prefetch pattern (by using a different base address for each subarray, but a same increment value). In the case that each subarray of DRAM 16 includes 100 rows, then while the address locations are being prefetched from subarray 1, dynamic refreshes can be done to base address (BA)+1, BA+2, BA+3, etc. of any one the other subarrays, or of multiple of the other subarrays in parallel. In one example, dynamic refreshes to X+100, X+101, X+102, etc. can be generated by address generator 30 as DR2 to subarray 2. In this example, the base address of subarray 2 (e.g. starting address) is "X+100" and increment 2 would be set to "1" since each subsequent address of the prefetch pattern increments by one. Also, dynamic refreshes (to X+200, X+201, X+202, etc.) can also similarly be generated by address generator 32 as DR3 to subarray 3 and dynamic refreshes (to X+300, X+301, X+302, etc.) by address generator 34 as DR4 to subarray 4, in which all these dynamic refreshes can be done to subarrays 2, 3, and 4 in parallel.

In yet another embodiment, prefetches can be performed by prefetcher 18 to a selected subarray to addresses C, C-3, C-6, C-9, etc. In this example, one or more of the address generators of dynamic refresh control circuit 26 can generate dynamic refreshes using the same pattern in one or more of the other subarrays. In this case, the base address for the one or more of the other subarrays is based on "C," and the increment for the address generator would be "−3." As with the above example, the dynamic refreshes to multiple subarrays can be performed in parallel.

Figure 3:
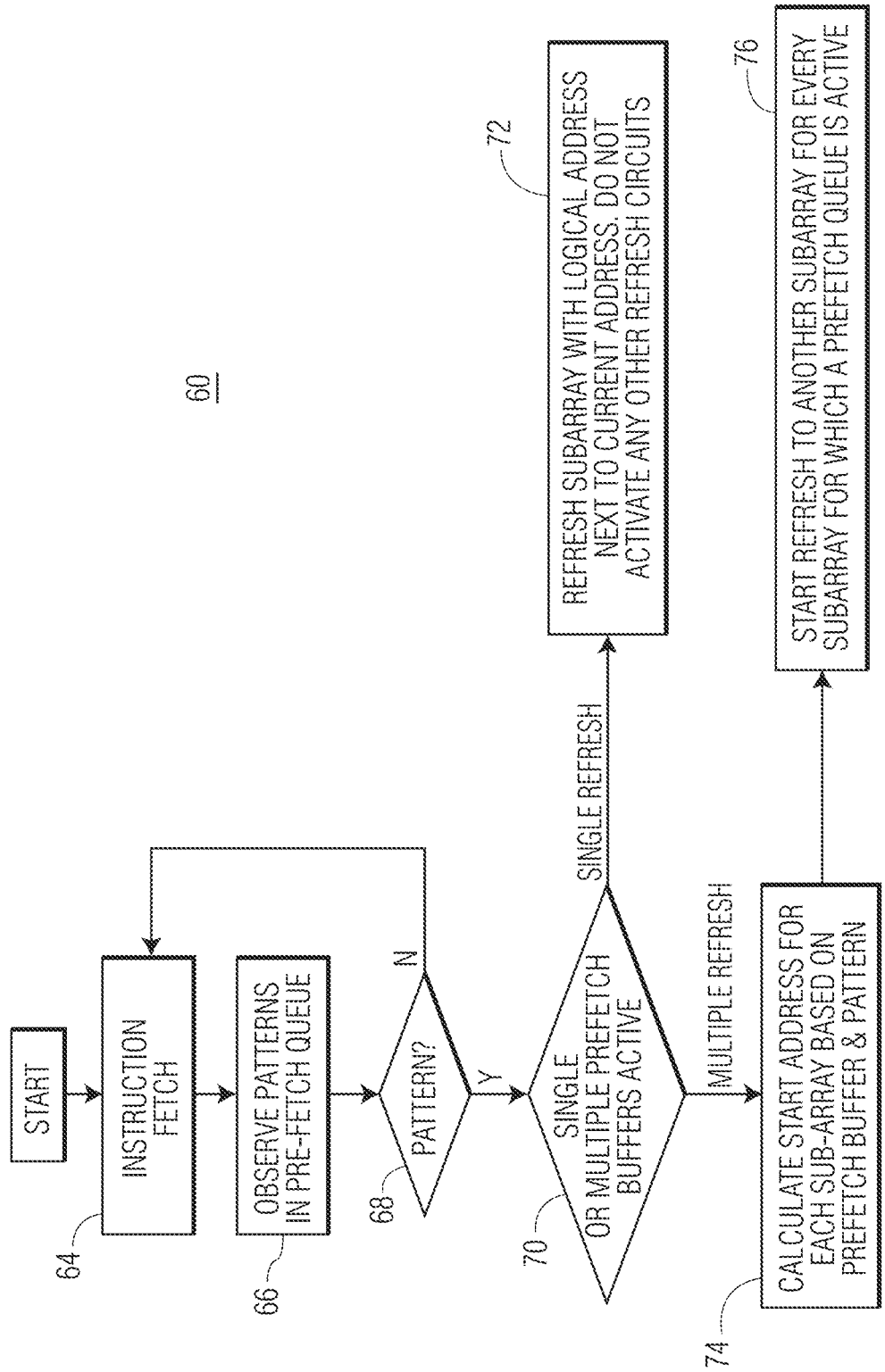
FIG. 3 illustrates, in flow diagram form, a method of performing dynamic refreshes in accordance with one embodiment of the present invention.

FIG. 3 illustrates, in flow diagram form, a method 60 for performing dynamic refreshes in response to an observed prefetch pattern, in accordance with one embodiment of the present invention. Method 60 starts at block 64 in which an instruction fetch is performed from DRAM 16, which may, for example, correspond to a prefetch read. This alerts dynamic refresh control circuit 26 to begin determining whether a prefetch pattern exists. Therefore, at block 66, dynamic refresh control circuit 26 observes the pattern in one or more of the Y prefetch buffers (i.e. prefetch queues). If, at decision diamond 68, no pattern is detected in any of the buffers, method 60 returns to block 64 until another instruction fetch occurs. However, if, at decision diamond 68, a pattern is detected, then at decision diamond 70 it is determined if a single prefetch buffer is active or if multiple prefetch buffers are active (in which an active buffer indicates that the buffer is implementing a prefetch pattern from a corresponding active subarray of DRAM 16).

In the case that a single prefetch buffer is active, method 60 proceeds to block 72 in which a dynamic refresh is performed of the subarray with logical addresses next to current addresses of the active subarray. The dynamic refresh follows the prefetch pattern used for prefetching from the active subarray to generate refreshes for the subarray being refreshed. In this case, only one subarray is refreshed (in which only one of the address generator circuits of dynamic refresh control circuit 26 is activated). Also, the subarray being refreshed in this example is the subarray with logical addresses next to the active subarray, but alternatively, can be any other subarray.

In the case that, at decision diamond 70, multiple prefetch buffers are active, method 60 proceeds to block 74 in which the start address for each subarray is calculated based on the prefetch pattern of the prefetch buffer. For example, this may correspond to calculating the base address for each subarray to be used by the corresponding address generator and increment of dynamic refresh control circuit 26. Then, at block 76, a dynamic refresh is started to another subarray for every subarray for which the prefetch queue is active. Therefore, in this case, the dynamic refreshes started in other subarrays can happen in parallel with each other and with read accesses in subarrays for which the prefetch queue is active.

With both the regular refreshes and dynamic refreshes occurring, the refreshes may conflict with each other. Therefore, each of the refreshes (R), and the dynamic refreshes (DR) are provided to R/DR priority circuit 36 to determine which refreshes are provided first to DRAM 16. In one embodiment, regular refreshes are prioritized over any dynamic refreshes, since these refreshes are based on periodic refresh requirements for a DRAM to reliably maintain its data. Priority circuit 36 also ensures that a same location in memory is not being refreshed by different master devices. For example, data processing system 10 may include other masters, in addition to processor 12, in which one or more of the prefetch buffers may correspond to prefetch requests from another master which shares access to DRAM 16. However, regardless of which master a prefetch buffer is servicing, the prefetch patterns can be detected by dynamic refresh control circuit 26 and trigger dynamic refreshes using the same address pattern as the prefetches in one or more other subarrays of DRAM 16. In one embodiment, the selection of which type of refresh to prioritize by R/DR priority circuit 36 may be user programmable (i.e. a programmable prioritization) such that a DR to a subarray or memory location may instead be prioritized over an R.

Figure 4:
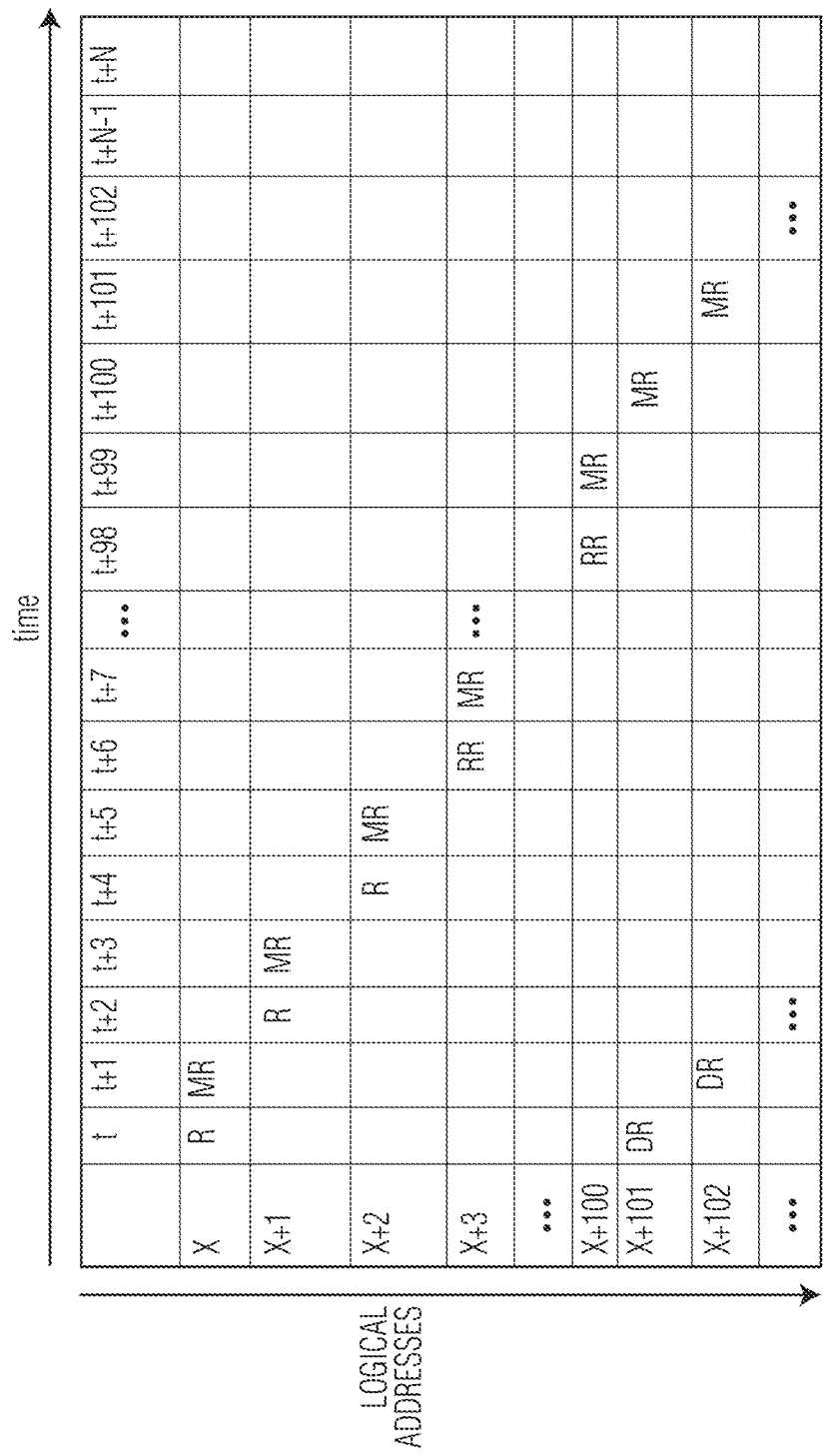
FIG. 4 illustrates, in table form, pipeline memory operations for the DRAM of FIG. 1, in accordance with one embodiment of the present invention.

FIG. 4 illustrates, in table form, pipeline memory operations for DRAM 16, in accordance with one embodiment of the present invention. Memory locations at increasing logical locations, in reference to base address X are labeled along the left side of the table, and increasing times are provided from left to right labeled along the top of the table.

In the illustrated embodiment, each subarray of DRAM 16 includes a set of 100 addresses, such that X through X+100 defines the first subarray, X+101 through X+200 the next subarray, etc. In the example of FIG. 4, it is assumed that memory prefetches from DRAM 16 are started at time t, with a stride of 1, such that at time t, a prefetch (i.e. a memory read MR) is performed from address location X), followed by a next sequential prefetch (i.e. a next MR) from address location X+1, then X+2, etc.

Initially, assuming that no dynamic refresh has been performed on the first subarray (X through X+100), a worst case scenario may occur in which a regular refresh which sequentially refreshes the rows of the first subarray may collide with the memory reads of the prefetch, which are also done sequentially. As discussed above, in many cases, refresh reads take priority over prefetch reads when they collide at a same address location. Therefore, when both sequential prefetches and sequential refreshes are started at time t, for each address, first a regular refresh is performed followed next by the prefetch read. Therefore, instead of performing the sequential prefetches at times t, t+1, t+2, t+3, etc., the sequential refreshes cause a stall with each sequential prefetch such that the sequential prefetches occur instead at times t+1, t+3, t+5, etc., at least for the first subarray.

Upon detecting the pattern of the prefetches, though, a dynamic refresh can begin in the next subarray (addresses X+101 through X+200) following the prefetch pattern of fetching sequentially with a stride of "1". This dynamic refresh can occur in parallel with the refreshes such that at time t, when the RR occurs followed by the MR at t+1 for address X, a DR occurs for X+101 at time t, followed by a DR for X+102 at time t+1. In this manner, by the time the second subarray is accessed for prefetches (e.g., at time t+100), the prefetches will no longer collide with refreshes because the refreshes were already done previously (due to the dynamic refreshes) starting at time t. Similarly, more than just the next subarray may be refreshed. For example, in addition to the DRs to the second subarrays, the third subarray (X+201 through X+300) may also be dynamically refreshed in parallel such that a DR occurs for X+201 at time t, followed by a DR for X+202 at time t+1, etc. More additional subarrays can be dynamically refreshed as well.

Even with dynamic refreshing, a penalty may still be incurred for the first subarray when a regular refresh collides with a prefetch pattern, but the penalty is prevented from occurring upon subsequent prefetches to the next subarray or the next multiple subarrays. That is, once a subarray has been dynamically refreshed in accordance with a prefetch pattern, it is likely that upon prefetching from that subarray, the memory cells will already have been refreshed, allowing for read accesses which are uninterrupted by a refresh cycle. If a prefetch does not maintain a same pattern in subsequent subarrays, though, no benefit may be achieved and the memory locations may not be adequately refreshed with the dynamic refreshes. However, by still performing regular refreshes of the subarrays of the DRAM, in addition to dynamic refreshes, it can be assured that all memory locations are properly refreshed, at least as often as needed to preserve the stored information. (Note that in one embodiment, performing regular refreshes can also take into account the cells which were already dynamically refreshed and can thus be excluded from the regular refresh. This may allow for further optimization.)

Therefore, by now it can be appreciated how prefetch patterns can be used to perform dynamic refreshes in a DRAM, in addition to periodic regular refreshes. By using the same address pattern for the dynamic refreshes as is used for the prefetches, the chance of collision between refreshes and prefetches can be reduced. In one embodiment, as a prefetch pattern is implemented in an active subarray of the DRAM, one or more multiple subarrays of the DRAM can receive dynamic refresh requests, based on the prefetch pattern, in parallel.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 16 may be located on a same integrated circuit as processor 12 and L1 14 or on a separate integrated circuit or located within another peripheral or slave discretely separate from other elements of system 10.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, DRAM 16 is illustrated in FIG. 1 as implemented a higher level (L2) cache, however, in alternate embodiments, DRAM 16 can be implemented for use in any type of application. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a data processing system includes a dynamic random access memory (DRAM) having a plurality of DRAM cells, each with a capacitive storage element; a prefetcher coupled to the DRAM and configured to prefetch information from the DRAM into a prefetch buffer in accordance with a prefetch pattern of addresses in the DRAM; and a refresh controller coupled to the DRAM, the refresh controller comprising a dynamic refresh control circuit coupled to the prefetcher and configured to detect prefetch patterns of the prefetcher, and, in response to a detected prefetch pattern, refresh locations of the DRAM in accordance with a refresh pattern of addresses which is based on the prefetch pattern of addresses. In one aspect, the refresh pattern uses a same address increment value as the prefetch pattern. In a further aspect, the address increment value can be a positive or negative integer. In another aspect, the DRAM includes a plurality of subarrays, each subarray including a mutually exclusive set of rows of the DRAM, wherein the prefetch buffer is associated with a first subarray of the plurality of arrays such that the prefetch pattern of addresses is located in the first subarray of the DRAM. In a further aspect, the detected prefetch pattern is detected in the first subarray, and the dynamic refresh control circuit is configured to, in response to the detected prefetch pattern, refresh locations of a second subarray of the DRAM, different from the first subarray, in accordance with the refresh pattern of addresses. In yet a further aspect, the dynamic refresh control circuit is configured to, in response to the detected prefetch pattern, refresh locations of the second subarray and a third subarray of the DRAM, different from the first and second subarrays, in accordance with the refresh pattern of addresses, wherein the refreshes of the second and third subarrays are performed in parallel. In another aspect, each subarray includes a corresponding row decoder configured to select a subarray row, corresponding read/write circuitry configured to perform reads from or writes to a selected subarray row, and a corresponding control circuit configured to receive refresh requests for the subarray. In another aspect, the refreshes of the second subarray are configured to be performed while prefetches are occurring in the first subarray. In another aspect of the embodiment, the refresh controller further includes a regular refresh control circuit configured to perform periodic refreshes of all rows of the DRAM. In a further aspect, the refresh controller further includes a timing control circuit, wherein the regular refresh control circuit is configured to perform the periodic refreshes in accordance with a refresh frequency indicated by the timing control circuit, and independent of prefetches performed by the prefetcher. In another aspect, the reset controller further includes a refresh priority circuit configured to receive dynamic refresh requests from the dynamic refresh control circuit and regular refresh requests from the regular refresh control circuit, and determine a priority between refresh requests when a dynamic refresh request collides with a regular refresh request. In a further aspect, the priority between refresh requests is programmable.

In another embodiment, a method of refreshing a dynamic random access memory (DRAM) having a plurality of DRAM cells, each with a capacitive storage element, includes detecting, by a refresh control circuit corresponding to the DRAM, a prefetch pattern of prefetch read addresses in the DRAM; in response to detecting the prefetch pattern of prefetch read addresses, refreshing locations of the DRAM in accordance with a refresh pattern of refresh addresses in the DRAM, wherein the refresh pattern of refresh addresses is based on the prefetch pattern of prefetch read addresses; in response to a timing control circuit, refreshing each row of the DRAM, in turn, in accordance with a DRAM refresh rate set by the timing control circuit; and when a dynamic refresh request generated during the refreshing locations of the DRAM in accordance with the refresh pattern collides with a regular refresh request generated during the refreshing each row of the DRAM, in turn, in accordance with the DRAM refresh rate, prioritizing one of the dynamic refresh request and the regular refresh request using a programmable prioritization. In one aspect, the DRAM includes a plurality of subarrays, each subarray including a mutually exclusive set of rows of the DRAM, wherein the detected prefetch pattern occurs in a first subarray of the plurality of subarrays, and the refreshing locations of the DRAM in accordance with the refresh pattern is performed in a second subarray of the plurality of subarrays, different from the first subarrays. In a further aspect, the method further includes, in response to the detecting the prefetch pattern in the first subarray, refreshing locations of each of the second subarray and a third subarray, different from the first and second subarrays, in accordance with corresponding refresh patterns of refresh addresses in the DRAM, wherein each corresponding refresh pattern is based on the detected prefetch pattern. In yet a further aspect, the refreshing locations of each of the second subarray and the third subarray are performed in parallel. In another aspect of the another embodiment, the detected prefetch pattern is generated by a prefetcher for the DRAM using an increment value to generate each next prefetch address of the prefetch pattern, wherein the refresh control circuit generates each next refresh address for the refresh pattern using the increment value, wherein the increment value is a positive or negative integer.

In yet another embodiment, a data processing system includes a dynamic random access memory (DRAM) having a plurality of DRAM cells, each with a capacitive storage element, the DRAM separated into a plurality of mutually exclusive subarrays; a prefetcher coupled to the DRAM having a plurality of prefetch buffers, each prefetch buffer configured to prefetch information from a corresponding subarray of the plurality of subarrays in accordance with a corresponding prefetch pattern of addresses in the corresponding subarray; and a refresh controller coupled to the DRAM. In this embodiment, the refresh controller includes a dynamic refresh control circuit coupled to the prefetcher and configured to detect prefetch patterns of the prefetcher, and, in response to detecting a prefetch pattern in its corresponding subarray, refresh locations in one or more other subarrays of the plurality of subarrays in accordance with corresponding refresh patterns of addresses, each of the corresponding refresh patterns based on the detected prefetch pattern; a regular refresh control circuit configured to periodically refresh each row of the DRAM, in turn, in accordance with a DRAM refresh rate; and a priority circuit configured to receive refresh requests from the dynamic refresh control circuit and the regular refresh control circuit, and prioritize the refresh requests when providing them to the DRAM. In one aspect, the dynamic refresh control circuit generates refresh requests independent of the DRAM refresh rate. In another aspect, each of the corresponding refresh patterns based on the detected prefetch pattern share a same increment value as used in the prefetch pattern to generate a next address, and the dynamic refresh control circuit is configured to refresh locations in the one or more other subarrays in parallel.

What is claimed is:
1. A data processing system, comprising:
 a dynamic random access memory (DRAM) having a plurality of DRAM cells, each with a capacitive storage element;
 a prefetcher coupled to the DRAM and configured to prefetch information from the DRAM into a prefetch buffer in accordance with a prefetch pattern of addresses in the DRAM; and a refresh controller coupled to the DRAM, the refresh controller comprising a dynamic refresh control circuit coupled to the prefetcher and configured to:
  detect prefetch patterns of the prefetcher, and
  in response to a detected prefetch pattern, refresh locations of the DRAM in accordance with a refresh pattern of addresses which is based on the prefetch pattern of addresses.

2. The data processing system of claim 1, wherein the refresh pattern uses a same address increment value as the prefetch pattern.

3. The data processing system of claim 2, wherein the address increment value can be a positive or negative integer.

4. The data processing system of claim 1, wherein the DRAM includes a plurality of subarrays, each subarray including a mutually exclusive set of rows of the DRAM, wherein the prefetch buffer is associated with a first subarray of the plurality of arrays such that the prefetch pattern of addresses is located in the first subarray of the DRAM.

5. The data processing system of claim 4, wherein the detected prefetch pattern is detected in the first subarray, and the dynamic refresh control circuit is configured to, in response to the detected prefetch pattern, refresh locations of a second subarray of the DRAM, different from the first subarray, in accordance with the refresh pattern of addresses.

6. The data processing system of claim 5, wherein the dynamic refresh control circuit is configured to, in response to the detected prefetch pattern, refresh locations of the second subarray and a third subarray of the DRAM, different from the first and second subarrays, in accordance with the refresh pattern of addresses, wherein the refreshes of the second and third subarrays are performed in parallel.

7. The data processing system of claim 4, wherein each subarray includes a corresponding row decoder configured to select a subarray row, corresponding read/write circuitry configured to perform reads from or writes to a selected subarray row, and a corresponding control circuit configured to receive refresh requests for the subarray.

8. The data processing system of claim 4, wherein the refreshes of the second subarray are configured to be performed while prefetches are occurring in the first subarray.

9. The data processing system of claim 1, wherein the refresh controller further comprises:
  a regular refresh control circuit configured to perform periodic refreshes of all rows of the DRAM.

10. The data processing system of claim 9, wherein the refresh controller further comprises a timing control circuit, wherein the regular refresh control circuit is configured to perform the periodic refreshes in accordance with a refresh frequency indicated by the timing control circuit, and independent of prefetches performed by the prefetcher.

11. The data processing system of claim 9, wherein the reset controller further comprising:
  a refresh priority circuit configured to receive dynamic refresh requests from the dynamic refresh control circuit and regular refresh requests from the regular refresh control circuit, and determine a priority between refresh requests when a dynamic refresh request collides with a regular refresh request.

12. The data processing system of claim 11, wherein the priority between refresh requests is programmable.

13. A method of refreshing a dynamic random access memory (DRAM) having a plurality of DRAM cells, each with a capacitive storage element, the method comprising:
  detecting, by a refresh control circuit corresponding to the DRAM, a prefetch pattern of prefetch read addresses in the DRAM;
  in response to detecting the prefetch pattern of prefetch read addresses, refreshing locations of the DRAM in accordance with a refresh pattern of refresh addresses in the DRAM, wherein the refresh pattern of refresh addresses is based on the prefetch pattern of prefetch read addresses;
  in response to a timing control circuit, refreshing each row of the DRAM, in turn, in accordance with a DRAM refresh rate set by the timing control circuit; and
  when a dynamic refresh request generated during the refreshing locations of the DRAM in accordance with the refresh pattern collides with a regular refresh request generated during the refreshing each row of the DRAM, in turn, in accordance with the DRAM refresh rate, prioritizing one of the dynamic refresh request and the regular refresh request using a programmable prioritization.

14. The method of claim 13, wherein the DRAM includes a plurality of subarrays, each subarray including a mutually exclusive set of rows of the DRAM, wherein the detected prefetch pattern occurs in a first subarray of the plurality of subarrays, and the refreshing locations of the DRAM in accordance with the refresh pattern is performed in a second subarray of the plurality of subarrays, different from the first subarrays.

15. The method of claim 14, further comprising:
  in response to the detecting the prefetch pattern in the first subarray, refreshing locations of each of the second subarray and a third subarray, different from the first and second subarrays, in accordance with corresponding refresh patterns of refresh addresses in the DRAM, wherein each corresponding refresh pattern is based on the detected prefetch pattern.

16. The method of claim 15, wherein the refreshing locations of each of the second subarray and the third subarray are performed in parallel.

17. The method of claim 13, wherein the detected prefetch pattern is generated by a prefetcher for the DRAM using an increment value to generate each next prefetch address of the prefetch pattern, wherein the refresh control circuit generates each next refresh address for the refresh pattern using the increment value, wherein the increment value is a positive or negative integer.

18. A data processing system, comprising:
  a dynamic random access memory (DRAM) having a plurality of DRAM cells, each with a capacitive storage element, the DRAM separated into a plurality of mutually exclusive subarrays;
  a prefetcher coupled to the DRAM having a plurality of prefetch buffers, each prefetch buffer configured to prefetch information from a corresponding subarray of the plurality of subarrays in accordance with a corresponding prefetch pattern of addresses in the corresponding subarray; and
  a refresh controller coupled to the DRAM, the refresh controller comprising:
    a dynamic refresh control circuit coupled to the prefetcher and configured to:
      detect prefetch patterns of the prefetcher, and
      in response to detecting a prefetch pattern in its corresponding subarray, refresh locations in one or more other subarrays of the plurality of subarrays in accordance with corresponding refresh patterns of addresses, each of the corresponding refresh patterns based on the detected prefetch pattern;

a regular refresh control circuit configured to periodically refresh each row of the DRAM, in turn, in accordance with a DRAM refresh rate; and a priority circuit configured to:
receive refresh requests from the dynamic refresh control circuit and the regular refresh control circuit, and
prioritize the refresh requests when providing them to the DRAM.

19. The data processing system of claim 18, wherein the dynamic refresh control circuit generates refresh requests independent of the DRAM refresh rate.

20. The data processing system of claim 18, wherein:
each of the corresponding refresh patterns based on the detected prefetch pattern share a same increment value as used in the prefetch pattern to generate a next address, and
the dynamic refresh control circuit is configured to refresh locations in the one or more other subarrays in parallel.

\* \* \* \* \*